United States Patent [19]

Ozawa et al.

[11] Patent Number: 5,599,194
[45] Date of Patent: Feb. 4, 1997

[54] IC SOCKET AND ITS CONTACT PIN

[75] Inventors: Kazuhisa Ozawa; Hiroaki Harada, both of Kawagoe, Japan

[73] Assignee: Enplas Corporation, Kawagoe, Japan

[21] Appl. No.: 206,080

[22] Filed: Mar. 3, 1994

Related U.S. Application Data

[63] Continuation of Ser. No. 931,925, Aug. 18, 1992.
[51] Int. Cl.$^6$ .................................................. H01R 9/00
[52] U.S. Cl. .................................................. 439/72; 439/73
[58] Field of Search .................... 439/68–73, 66, 439/91, 78, 326–328

[56] References Cited

U.S. PATENT DOCUMENTS

| | | | |
|---|---|---|---|
| 4,959,029 | 9/1990 | Grabbe | 439/71 |
| 4,995,816 | 2/1991 | Grabbe | 439/71 |
| 5,240,421 | 8/1993 | Uratsuji | 439/71 |

*Primary Examiner*—David L. Pirlot
*Attorney, Agent, or Firm*—David O'Reilly

[57] ABSTRACT

A contact pin having a thin wall construction that makes good electrical connection with an IC socket without insulation due to oxide film forming on the surface of the lead and which does not easily break due to plastic deformation. An IC socket has a feature to prevent an IC device position from deviating and deforming its leads which can automatically position the IC device for secure contact with contact pins of an IC frame having leads by limited positioning of the IC device on a stage.

7 Claims, 13 Drawing Sheets

F I G. 3
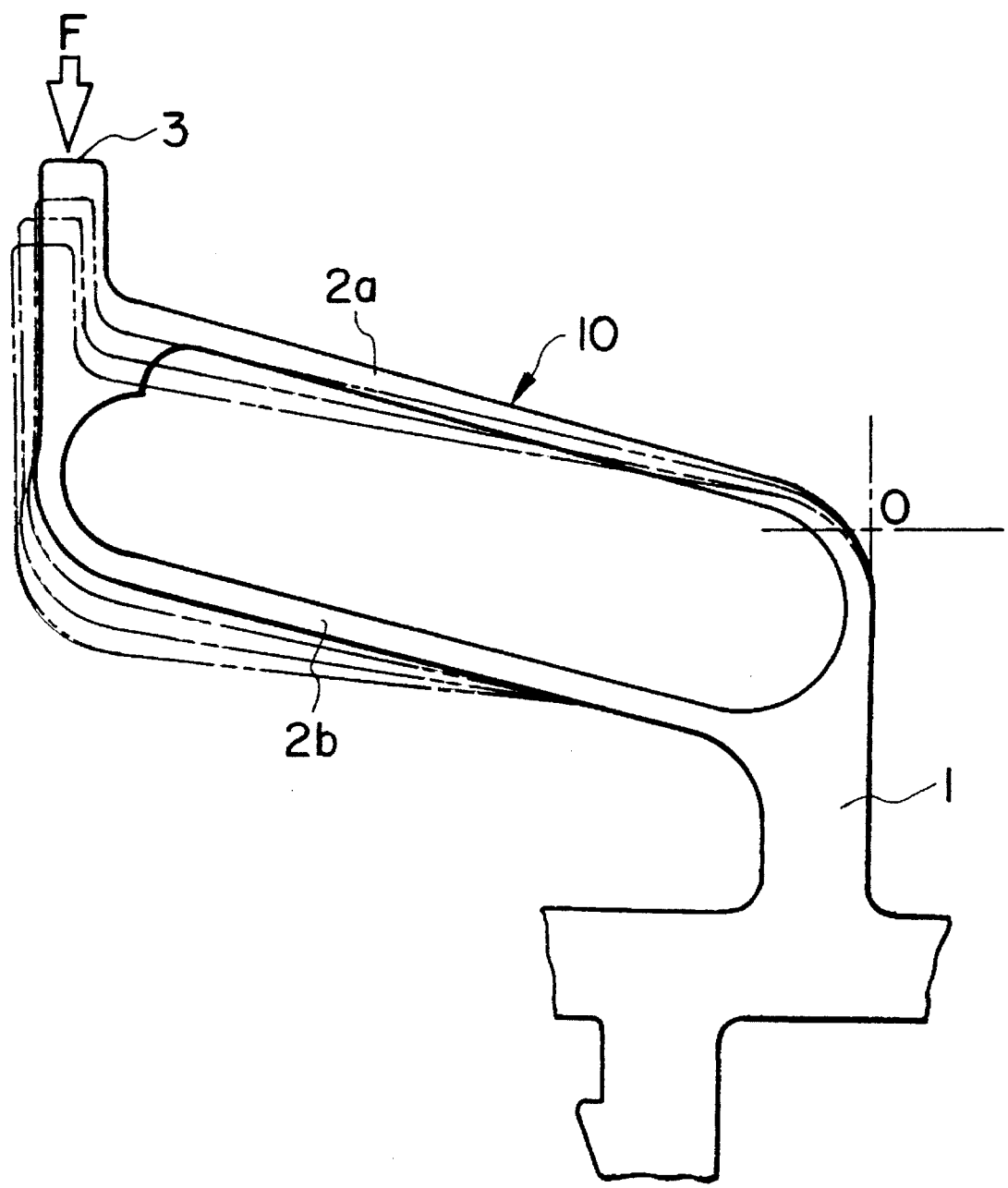

IC SOCKET AND ITS CONTACT PIN

CROSS-REFERENCE TO RELATED APPLICATIONS

This Application is a Continuation of applicant's co-pending Patent Application Ser. No. 07/931,925 filed Aug. 18, 1992.

FIELD OF THE INVENTION

The present invention relates to a contact pin for IC sockets for making electrical connections between leads of an IC device and external circuits.

More particularly, the invention concerns multiple, very thin wall contact pins aligned at very close intervals for use in a multi-pin IC socket.

Also, the invention relates to an IC socket for ease in electrical connection with external circuits, with the IC socket having an IC device or similar electronic parts mounted thereon.

More particularly, the invention concerns an IC socket having contact pins aligned at very close intervals on a socket body for contact with leads of an IC device for electrical connections with leads of external circuits.

Further, the invention relates to the structure of an IC socket for electrical connection with external circuits, with the IC socket having an IC device or similar electronic parts mounted thereon.

BACKGROUND OF THE INVENTION

In Japanese Patent Application Laid-Open 61-150249, a ring-like contact pin of thin wall construction is proposed for use in an IC socket which is used for mounting an IC device or similar electronic parts (see FIG. 17). In an IC socket, as shown in FIGS. 18 and 19, the leads of an IC device positioned on top 3 of a multiple contact pin 10' (FIG. 17) and aligned on a socket body 20 are pressed toward contact pin 10' by pads 21-1 and 21-2 fitted on cover 21 linked on socket body 20 by shaft 23 as the cover is closed.

However prior art pins similar to contact pins 10' have the disadvantage of poor electrical connection due to an insulation of oxide film formed on the surfaces of the leads; and each contact pin 10', when pads 21-1 and 21-2 fitted on cover 21 are pressed for connections of the leads and contact pins 10' as cover 21 is closed.

Also, prior art contact pins similar to contact pin 10' have the disadvantage that they are too weak to endure severe plastic deformation as they are made of ring plates having a very thin wall.

In view of the foregoing, it is an object of the present invention to provide multiple contact pins of very thin wall construction and having good electrical connection for an IC socket without an oxide film insulation likely being formed on the surface of leads and contact pins and without breaking due to plastic deformation.

Further, prior art IC sockets having mount contact type contact pins 10' have the disadvantage that it is hard to align the leads of the IC device in positions between guide walls provided in the IC socket. Furthermore, it has a disadvantage that the leads may be bent or broken if deformed when the cover 21 is closed.

Accordingly, it is another object of the present invention to provide an IC socket that has a feature for preventing the position of an IC device from deviating and its leads from being deformed. This allows the IC device to be automatically positioned for secure contact between contact pins with lead frames by simply placing the IC device in a limited range on a stage.

In recent IC sockets, numerous contact pins have to be aligned at intervals closer than usual as the IC devices are made more dense in order to make camera-equipped VTRs, portable telephone sets, and similar electronic devices smaller and with increased features. Such finer alignment leads have a more difficult task of forming the guide walls for positioning the contact pins and guiding and restricting the contact action of the contact pins with leads.

There is a disclosure about a connector for an IC mounting board in Japanese Utility Model Application Laid Open Sho 58-70687. In the disclosed connector there are projected contact portions for mounting pins of the IC mounting board on free ends of elastic contact arms. Guide pieces project in the vicinity of the contact portions. The guide pieces are positioned in guide grooves (guide walls) formed on a socket body to guide elastic displacements of the elastic contact arms. A feature of the connector is the easy forming of a socket body as the elastic contact arms corresponding to the contact pins can be partly guided on their front free ends and rear fixed ends.

The inventors have also proposed multiple contact pins of very thin wall construction having securing strength at very close intervals for an IC socket in the Japanese Utility Model Application Hei 3-41476. The contact pins, as shown in FIG. 1 have a ring-like contact arm 2 formed of a pair of arm portions 2a and 2b opposing each other. Contact arm 2 also has contact portion 3 formed at its front free end to contact a lead of an IC device (not shown). Contact arm 2 is connected with the base of contact pin 10 by way of neck 1 on its rear fixed end.

Contact pin 10 can have a secure contact action with the lead of an IC device without twisting at its arm portions 2a and 2b, even if it is formed as a very thin construction. This is because force F, exerted downward toward contact pin 10, as shown in FIG. 2, is dispersed up and down by the pair of opposed arm portions 2a and 2b.

However, the prior IC socket described above has the disadvantage that adjacent contact pins 10 may likely contact each other as they tend to easily flex in an aligning direction, although they have enough vertical strength to endure force F as described above. As contact pins 10 are embedded in the socket body, it is difficult to prevent them from making contact at their mid portions in the construction of the connector of Japanese Utility Model Application Laid Open Sho 58-70687 described above where the elastic contact arm is guided by its front free end and rear fixed end.

Accordingly, it is still another object of the present invention to provide an IC socket that allows contact pins aligned at very close intervals to securely move.

The contact pins of a conventional IC socket shown in FIG. 18 are usually 0.2 to 0.4 mm thick. In order to prevent adjacent contact pins from touching each other, the IC socket has multiple guide walls provided therein. Since the guide walls are aligned at relatively wide intervals, they are made of synthetic resin and integrated in the socket body.

As described above, the contact pins are designed so that as force F is exerted down on the top portion of any of the contact pins, it can be effectively dispersed by the arm portions. The contact pins can be made to securely contact the leads of the IC device even when the contact pins are as thick as 0.13 to 0.18 mm.

However, although the contact pins of a conventional IC socket can be made thin, it is extremely difficult to align them at very narrow intervals as the multiple guide walls are made of synthetic resin to integrate with the socket body. In other words, the guide walls may have insufficient filling with a molding material when injection-molded.

In view of this, it is still another object to provide an IC socket that can be molded and assembled easily and effectively for an increased number of pins of an IC device aligned at narrower intervals.

BRIEF DESCRIPTION OF THE INVENTION

Contact pin 10 according to the present invention is described with reference to FIG. 3. Pin 10 is moved as indicated in phantom if force F is exerted down on top 3 thereof. It is seen by analysis that contact pin moves around a center of motion 0. Center of motion 0 is at a position located a little outside the boundary of contact pin 10.

FIG. 4 shows a single-plate contact pin 10 of a shape similar to the one in FIG. 3. Center of wiping motion 0 at contact portion due to force F is within the boundary of contact pin 10.

FIGS. 5 and 6 show contact pins 10 of other shapes having parts of ring-like arms cut out. Center of wiping motion 0 of any of contact pins 10, is located substantially within the boundaries.

FIG. 8 is a graph showing the amount of wiping on the abscissas axis and distortion on the ordinate axis. Curves A,B,C and D correspond to the devices shown in FIGS. 3,4,5 and 6. It is found from the graph that contact pin 10 comprising a ring of two arm portions according to the present invention is low in wiping when distortion is largest. In this case, top 3 of the ring, as shown in FIG. 7, must not be moved down linearly with zero wiping.

In order to prevent breaking due to plastic deformation when excessive force F is exerted on top 3 of contact pin 10, the ring should have restriction member 19 provided therein as shown in FIG. 7. Restriction member 19 keeps neck 1 of contact pin 10 from being deformed.

In contact pin 10 according to the present invention, the distortion caused by a pad on the cover as it closed is large as two opposite vector forces are exerted on two arm portions. Wiping also can be securely made. Restriction member 19 provided in the ring prevents the arm portions from being unnecessarily distorted in event of an accident due to excessive force.

The IC socket comprises in combination: a socket body having multiple contact pins aligned for electrical connection with the leads of an IC device, a platform for mounting the IC device thereon, actuation fitting projections, spring means, an intermediate plate which is placed vertically to allow movement upward of the spring way, a slope for guiding the leads of the IC device, a rest for positioning the IC device, a floating plate for restricting the intermediate plate from moving up, and a cover being aligned with the socket body, a pad and projections capable of fitting with projections of the intermediate plate. The above is characterized by the projections of the cover pressing the projections of the intermediate plate to lower the it down in order to the sides of the contact pins as the cover is closed, the IC device mounted on the platform of the intermediate plate is put in position on the rest, and the pad of the cover presses the contact pins into electrical connection with the leads.

Also, the IC socket is characterized by multiple contact pins aligned on a socket body placed on leads of an IC device, and pressed onto the leads as the IC device is pressed by a cover linked with socket body which is in a closed position. Each contact pin has a ring contact arm comprising a pair of arm portions opposing each other, a guide and a restriction portion formed on a front free end and a rear fixed end of the contact arm of the contact pin as a guide wall in order to align the contact pin on the socket body. The contact arm has insulating areas, at least, on the front free end and the rear fixed end.

Further, the IC socket is characterized by: a multiple of ring-like contact pins aligned on a socket body placed on leads of an IC device; the leads being pressed in order to press the contact pins onto the respective leads as a cover having a pad linked with the socket body is closed. A shaft, having guide walls fitting between the contact pins, is inserted in rings of the contact pins and fixed on the socket body so that the contact pins are isolated from each other.

Furthermore, the IC socket is characterized by: both ends of the shaft fitting in resting grooves and formed on posts provided at corners of the socket body, and keys fitting in keyways of both ends of the shaft and the resting grooves to lock the shaft being. Both ends of the fitted and locked shaft are enclosed by a cover, with the shaft integrated with the socket body by fastening means.

The above and other features of the present invention will be more fully understood from the following detailed description and the accompanying drawings, in which:

BRIEF DESCRIPTION OF THE DRAWINGS

FIG. 3 is an illustration of the wiping action of the contact pin according to the present invention.

DETAILED DESCRIPTION OF THE INVENTION

Embodiment 1

Figure 1:
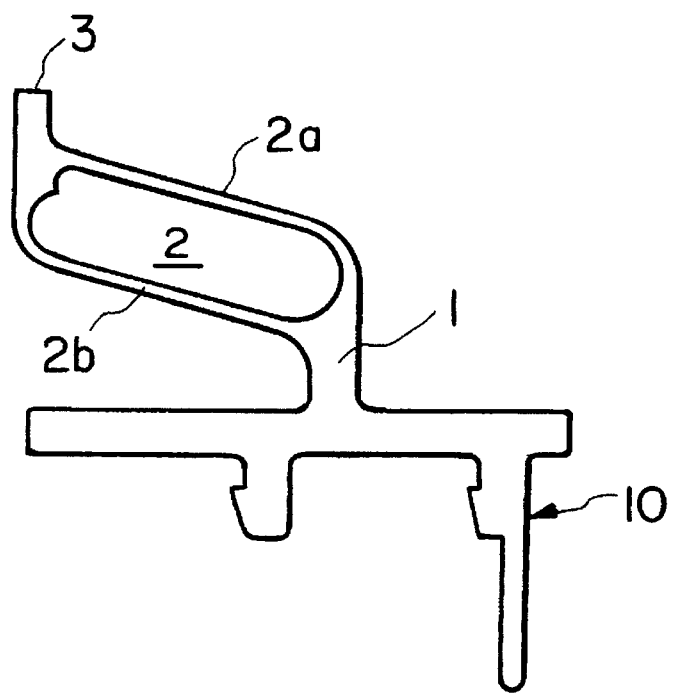
FIG. 1 is a front view of a first embodiment of a contact pin according to the present invention.
Figure 2:
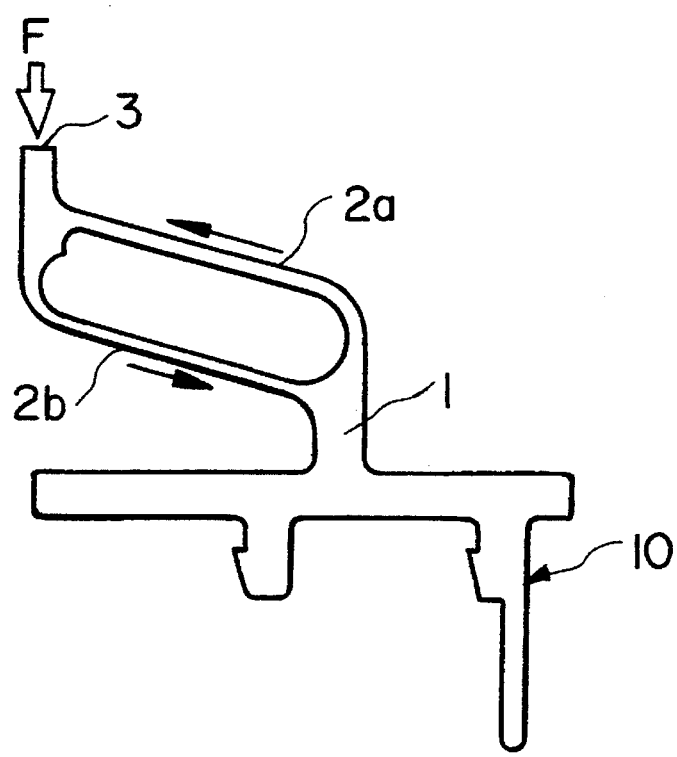
FIG. 2 is an illustration of the contact pin of FIG. 1 to which a force is exerted.
Figure 4:
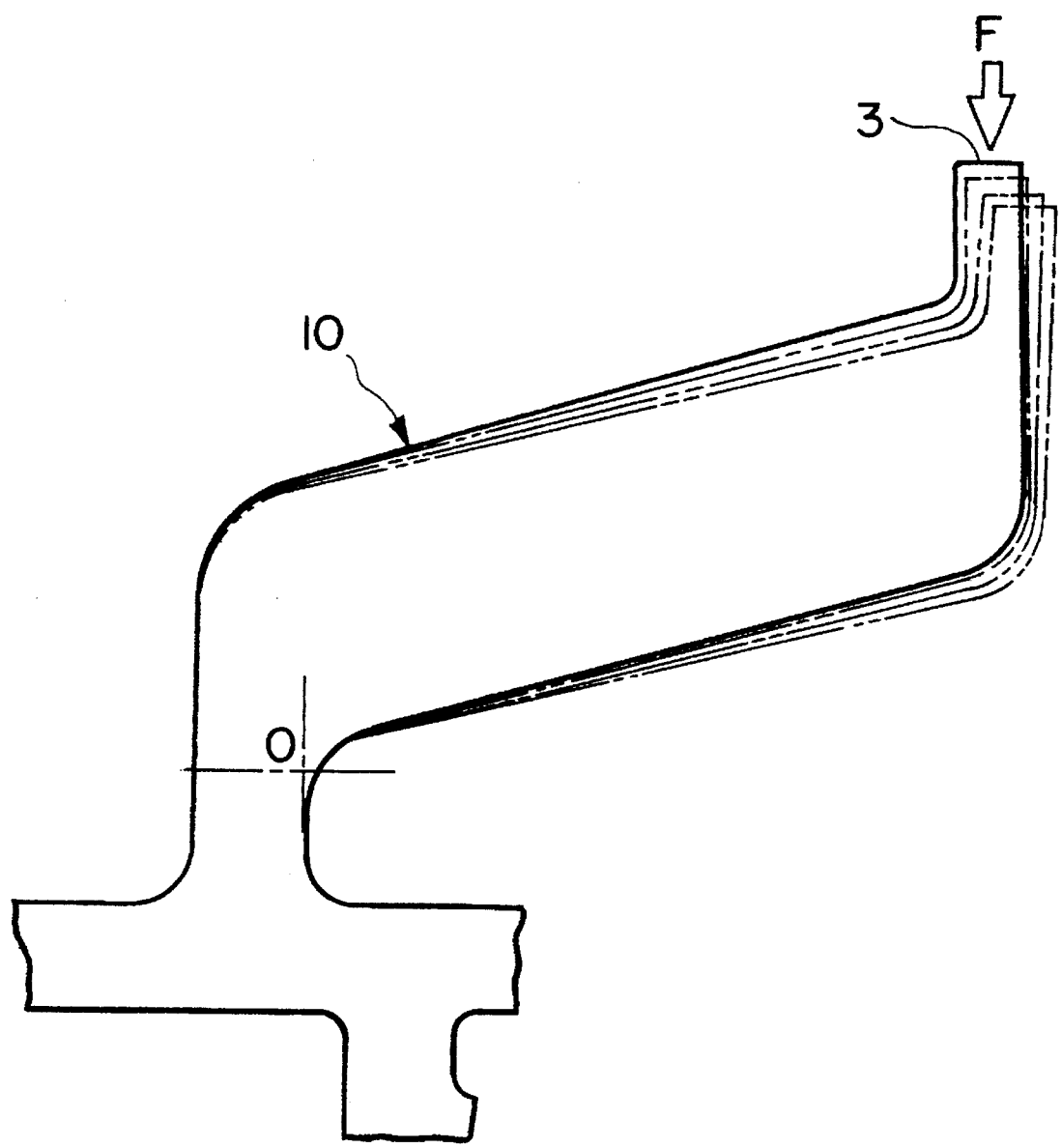
FIG. 4 shows a single-plate contact pin of a shape similar to the one in FIG. 3.
Figure 5:
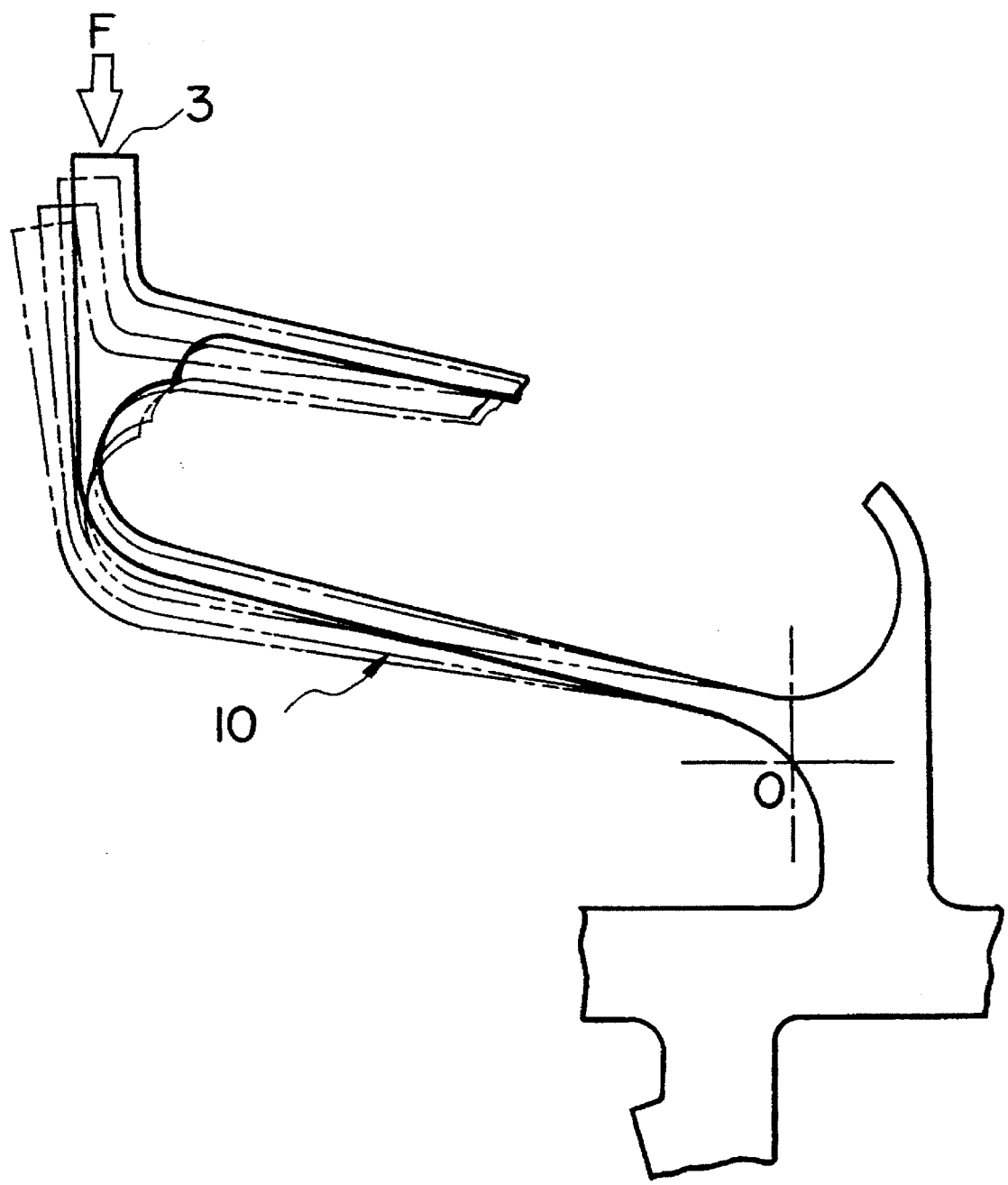
FIG. 5 and FIG. 6 show other shapes of contact pins with parts of ring-like arms cut out.
Figure 6:
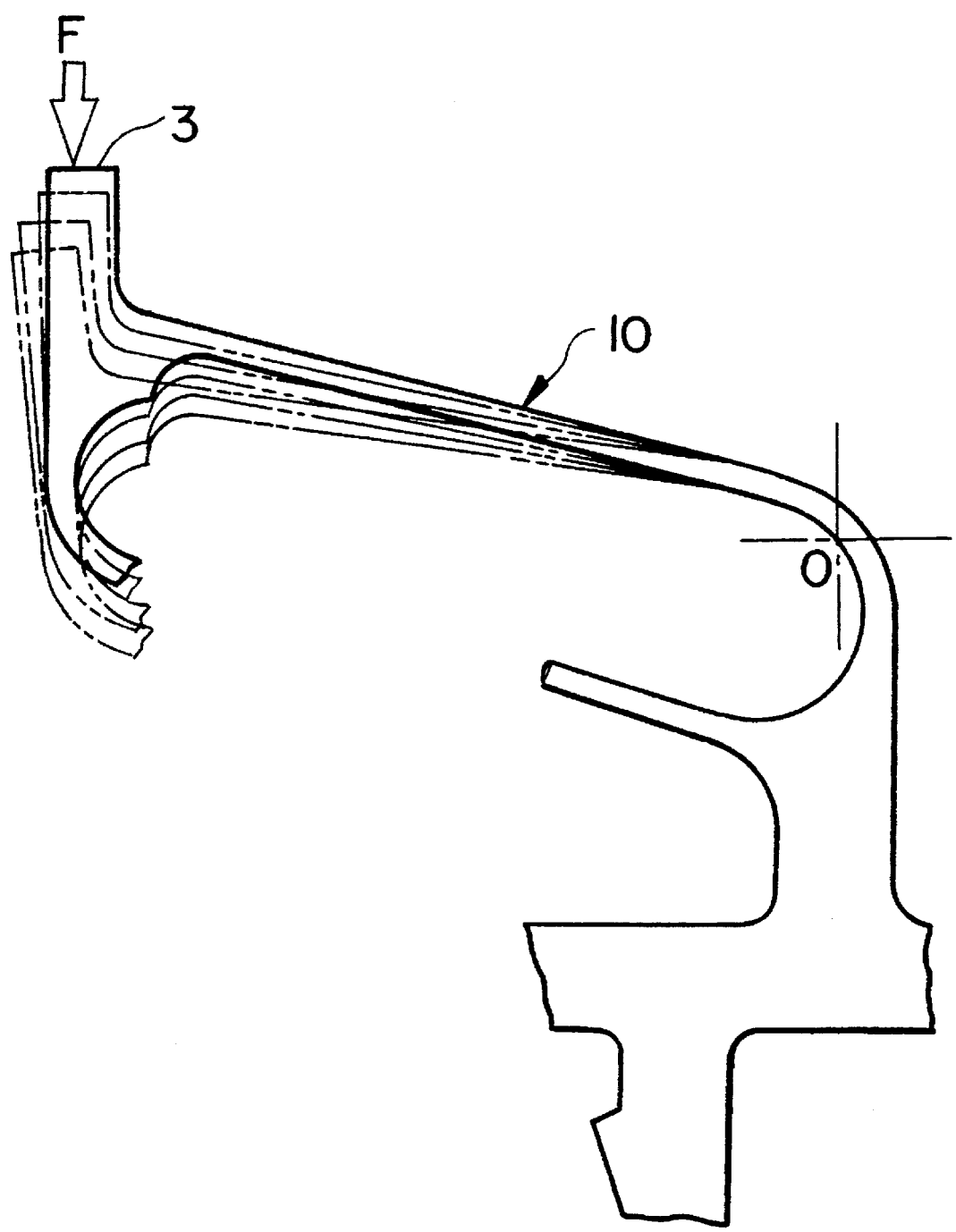

FIG. 1 shows a contact pin 10 of a first embodiment according to the present invention. Contact pin 10 cannot be twisted or fall down even if its wall thickness is made thin, since a force F, exerted downward on contact pin 10, is dispersed upward and downward by its two arms as shown in FIG. 2. In addition, contact pin 10 has little wiping (rubbing) even if greatly distorted since the wiping center is deviated a little out of its form. For these reasons, contact pin 10 is optimum for a lead frame of a short type which tends to have substantially more pins.

Figure 7:
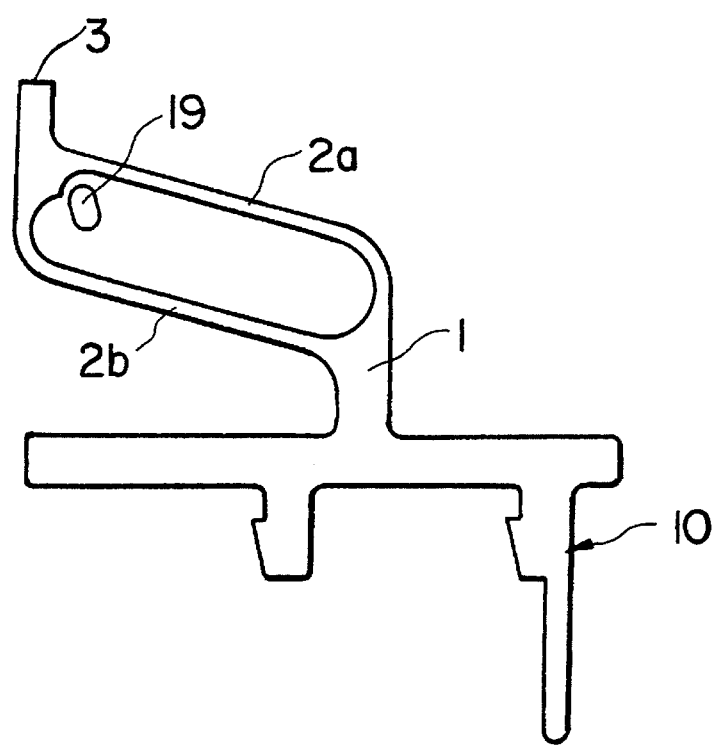
FIG. 7 is a front view of a contact pin with a restriction member added thereto according to the present invention.
Figure 8:
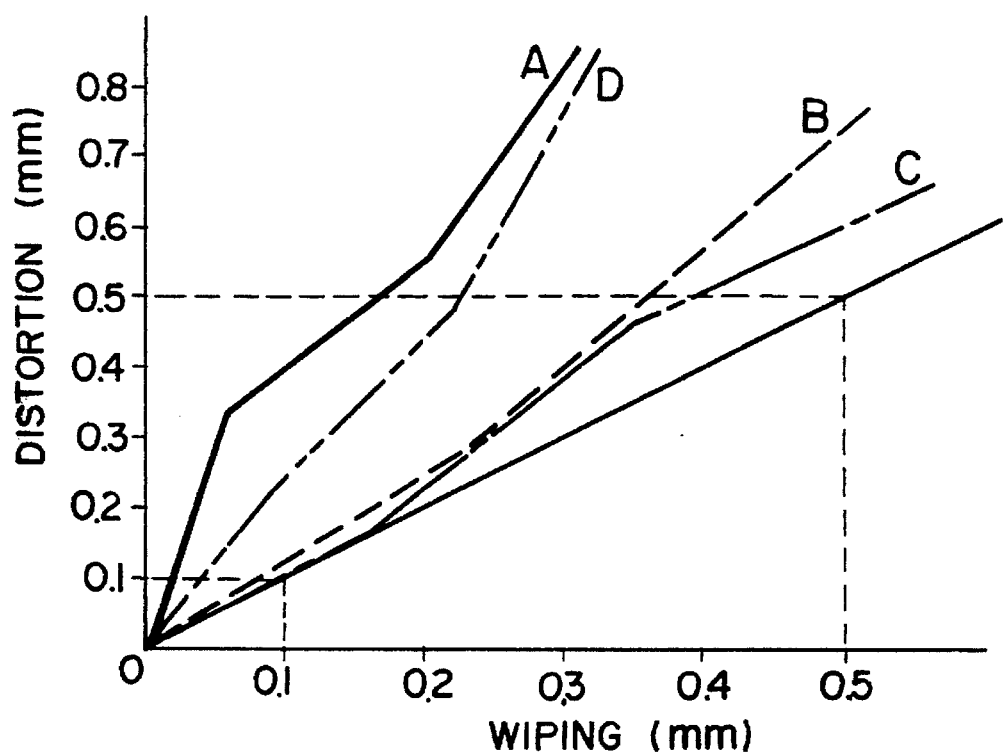
FIG. 8 is a graph showing the amount of wiping (rubbing) on the axis of abscissas and the distortion on the axis of ordinates.

As shown in FIG. 7, contact pin 10 can have restriction member 19, such as a pin, provided at a left end inside a ring of contact pin 10 to prevent plastic deformation from breaking the contact.

As described above, contact pin 10 according to the present invention has the advantage that it cannot be twisted or fall down even if it is thin. It can be securely wiped against the lead of an IC device. The restriction member provided in the ring prevents the arm portions from being unnecessarily distorted in the event of an accident causing excessive force.

Embodiment 2

Figure 9:
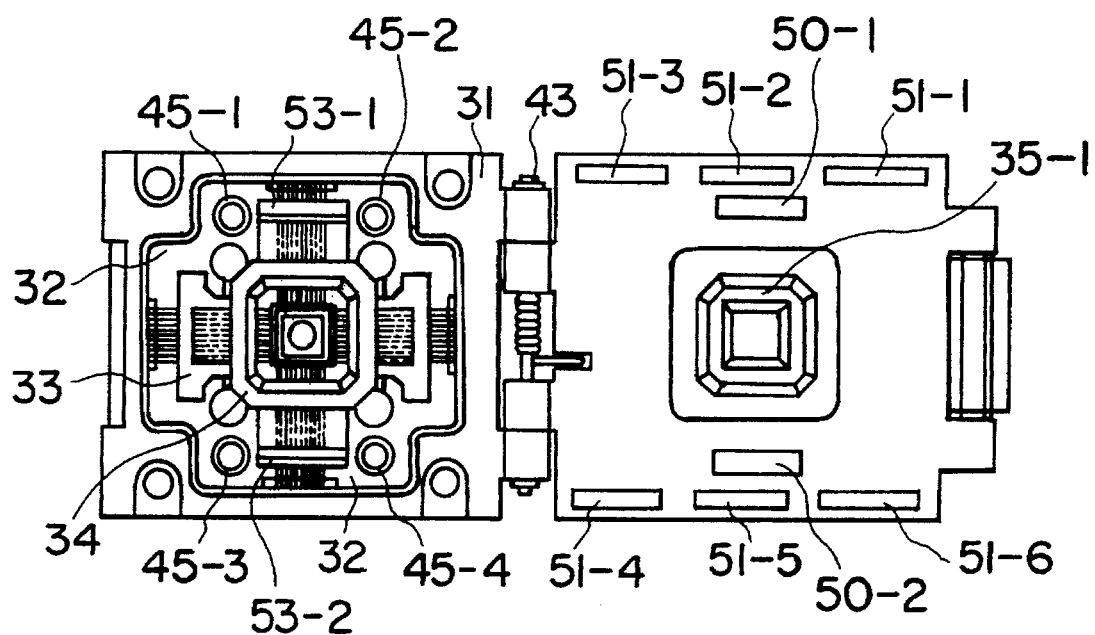
FIG. 9 is a plan view of a second embodiment of an IC socket according to the present invention.
Figure 10:
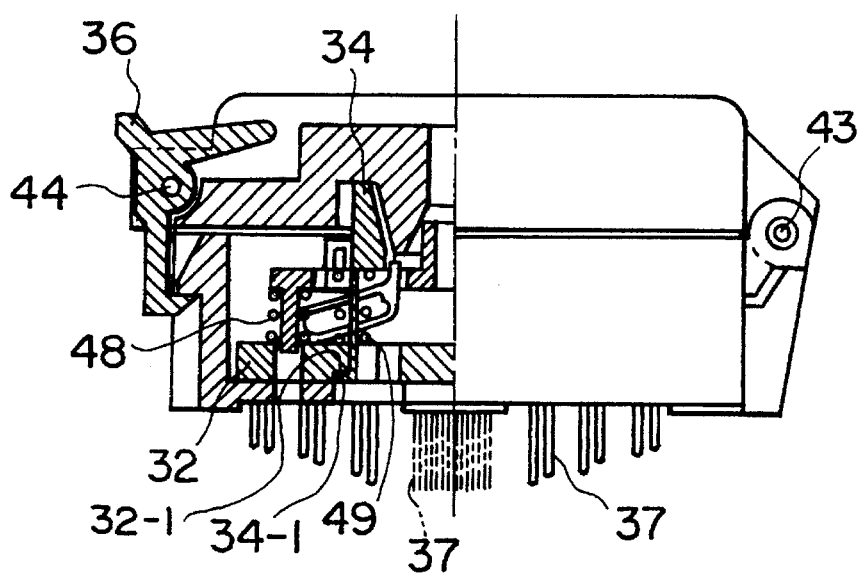
FIG. 10 is a partly cross-sectioned side view of the second embodiment.
Figure 11:
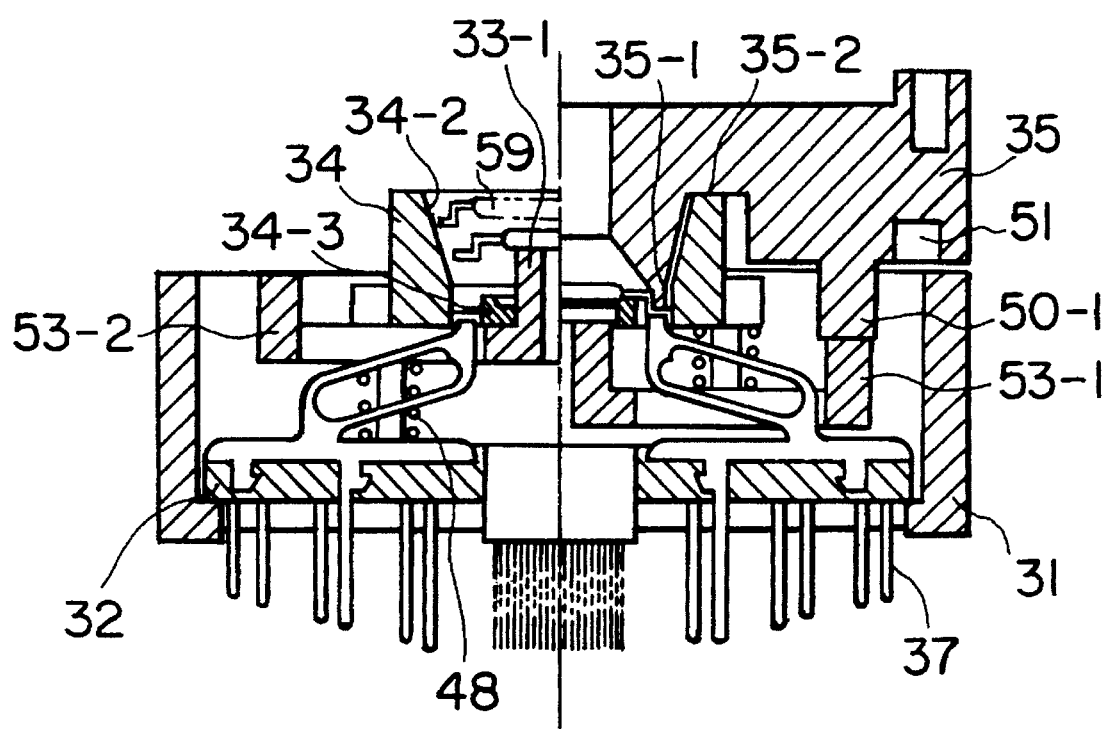
FIG. 11 is a cross-sectioned side view illustration of the second embodiment.
Figure 18:
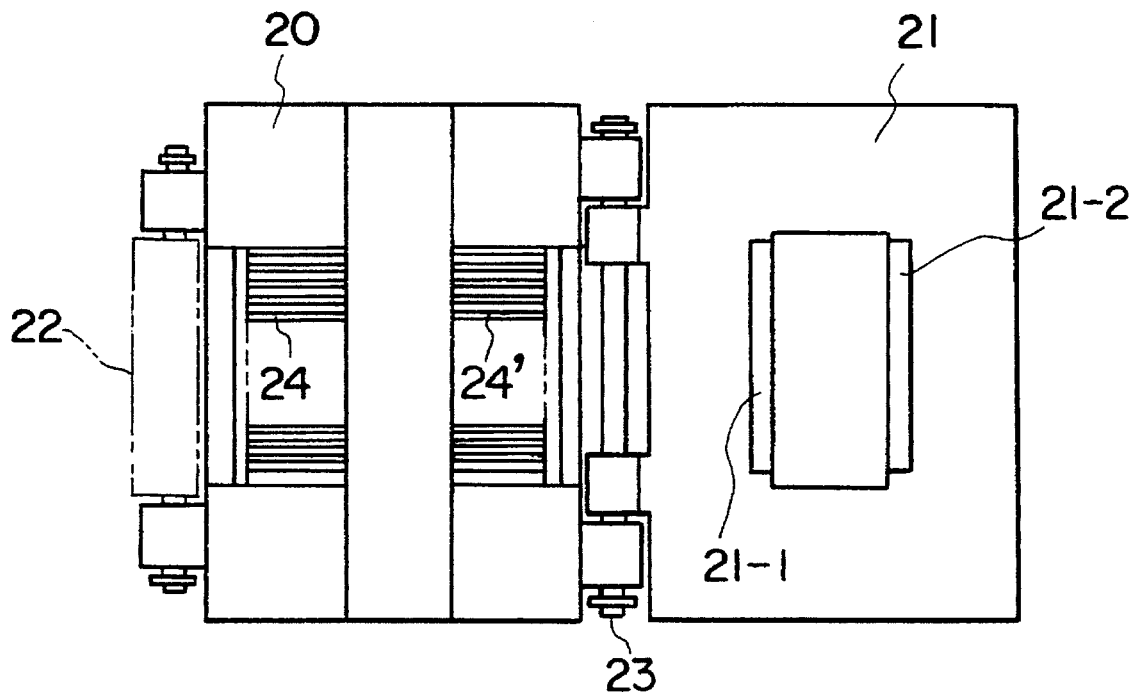
FIG. 18 is a plan view of a conventional IC socket.
Figure 19:
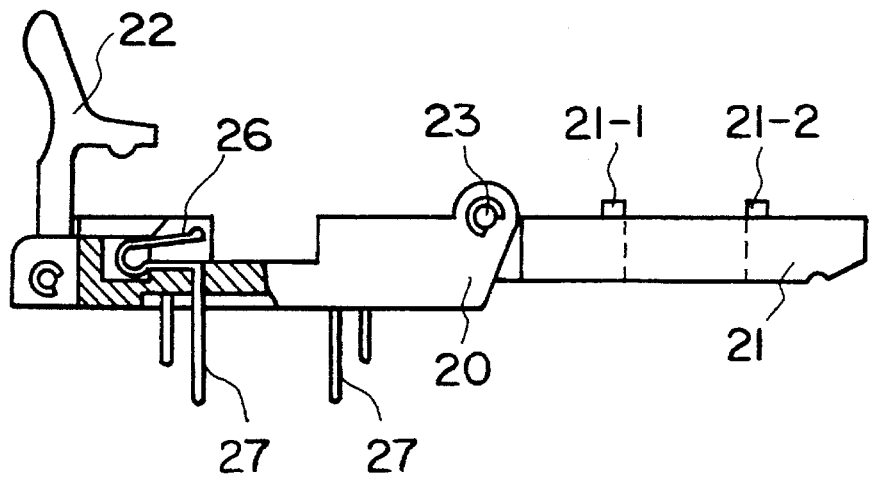
FIG. 19 is a partly cross-sectioned side view of the conventional IC socket in FIG. 18.

FIGS. 9 through 11 show a second embodiment of the IC socket according to the present invention. The arrangements and parts in the figures are identical with those in a conventional IC socket shown in FIGS. 18 and 19, and are indicated by the same numbers as in FIGS. 18 and 19. FIG. 9 is a plan view with the cover open. FIG. 10 is a partly cross-sectioned side view of the IC socket having no IC mounted with the cover closed. FIG. 11 is a cross-sectioned side view for the IC socket having the IC mounted with its right half closed and the left half open.

In the figures, base 32 has contact pins 37 of very thin wall construction (around 0.12 mm) placed therein at narrow intervals. Base 32, as shown in FIG. 9, is integrated with socket body 31 at four points by rivets 45-1 through 45-4. Each of contact pins 37 is partitioned by guide walls provided on intermediate plate 33 extending upward on base 32. There are provided coil springs 48 to produce upward spring force through bosses provided at four positions on the intermediate plate 33. (Two of the four positions are shown in FIG. 11).

Above intermediate plate 33, is provided floating plate 34 to prevent intermediate plate 33 from moving upward. Floating plate 34 can move up and down by coil springs 49 and its upper movement is restricted as shown in FIG. 10. Namely, floating plate 34 is restricted in its upward movement by a plurality of stopping pawls 34-1 provided on stopping portion 32-1 on base 32 side and floating plate 34. Socket body 31 has cover 35 hinged by pin 43 as in the conventional IC socket.

If IC device 59 is mounted on stage 33-1 and provided around a center of intermediate plate 33 as shown in FIG. 11, IC device 59 starts moving downward along slope 34-2 of floating plate 34 even if it is not placed in position as shown in the shaded area. IC device 59 moves into position to be mounted on stage 33-1 provided around the center of intermediate plate 33. As cover 35 is closed, projections 50-1 and 50-2 provided on cover 35 press projections 53-1 and 53-2 of intermediate plate 33 to simultaneously start moving downward stage 33-1. IC device 59 then is positioned below rest 34-3 of floating plate 34.

With the operation described above, the IC leads are gradually moved along a straight portion from slope 34-2 to be put in position on rest 34-3. Pad 35-1 of cover 35 is loaded to properly press the IC leads so that they can contact the contact pins for electrical connection. This allows the partition walls of intermediate plate 33 to move up and down along spring portions of the contact pins even when the contact pins are very thin. This prevents the contact pins from being twisted or collapsing.

So far, the second embodiment has been described with the use of the IC device of a QFP (quad flat package) type. Of course, it can be applied to any lead shapes of straight and bent type. It also has been described for separation of socket body 31 and base 32. Alternatively, these can be integrated together.

As described above, the IC socket according to the present invention can move the IC device down along the slope and straight portion of the guide walls to place it in position on the rest.

In addition, contact pins of even very thin construction allow the partition wall of the intermediate plate to move up and down along the deformation of the spring portion to restrict both ends of the spring portion. This prevents contact pins from being twisted and collapsing.

Embodiment 3

Figure 12:
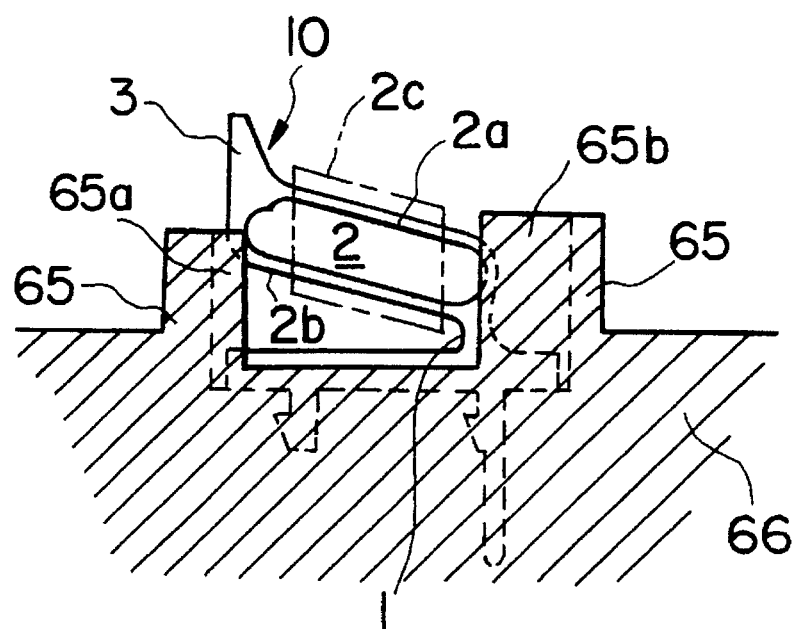
FIG. 12 is a cross-sectioned side view of major parts of a third embodiment of an IC socket according to the present invention.
Figure 13:
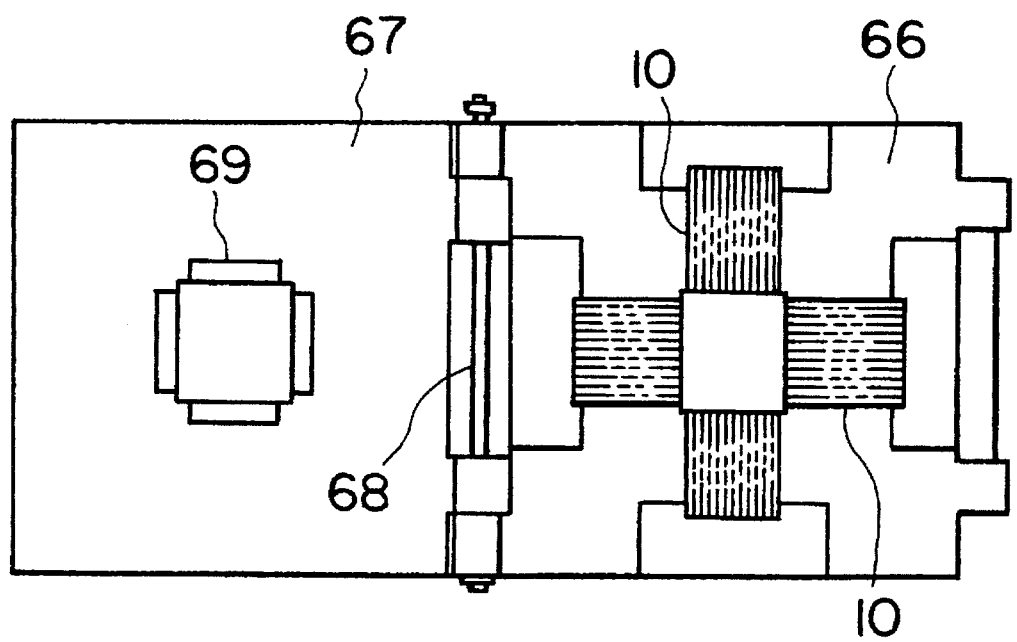
FIG. 13 is a plan view of the third embodiment.

FIGS. 12 and 13 show a third embodiment for the IC socket according to the present invention. The arrangements and parts in the figures are identical with those in the conventional IC sockets of FIGS. 18 and 19, and are indicated by the same numbers as in FIGS. 18 and 19. The shape of the contact pin 10 and other basic constructions of the IC socket are the same as those in the conventional ones or in the prior embodiment. A front free end of contact arm 2, as shown in FIG. 12, is put in socket body 66 to be guided and restricted by one slit 65a of guide wall 65, and a rear fixed end of contact arm 2 is fastened in the other slit 65b of guide wall 65. FIG. 13 shows many contact pins 10 arranged on socket body 66.

In the figure, 67 is cover hinged to socket body 66 by shaft 68, and pad 69 is provided inside cover 67 to press contact portion 3 of contact pins 10 to leads as cover 67 is closed. Contact pins 10, as shown in FIG. 12, has an insulating means 2c formed therefore which, for example, is formed by coating an insulating material at least on the front free end and the rear fixed end of contact arm 2.

Since the IC socket according to the present invention is made up as described above, the leads of the IC device are pressed to corresponding contact portions 3 as cover 67 is closed with the contact portions 3 of contact arms 2 of the contact pins 10 having the respective IC device leads mounted thereon. This makes electrical contact of the IC device with the contact pins 10. Each of contact arms 2, of contact pins 10 and, as described above, are formed by a pair of arms 2a and 2b. This assures proper contact action of each of the contact arms 2 with the respective IC device leads without twisting by pressing force F being exerted on the leads as shown in FIG. 2. Note that in the figure, number 1 indicates a neck of contact pin 10.

If any of contact pins 10, arranged very closely, is deflected in a longitudinal direction during its contact action, an adjacent contact pin may contact it. Such a short circuit can be prevented in that as described above contact pins 10 are insulated from each other with each of contact arms 2 having the insulating means 2c formed therefore.

This means that the electrical contacts of the IC device with contact pins 10, can be made surely and securely. The secure contact action of contact pins 10 free of such erroneous electrical contact between contact pins 10, allow for realistically effective arrangement of minute intervals and thin wall construction of contact pins 10.

As described above, the IC socket having the contact pins of thin wall aligned at very narrow intervals and according to the present invention, has the advantage that the contact action secure and can be easily formed.

Embodiment 4

Figure 14:
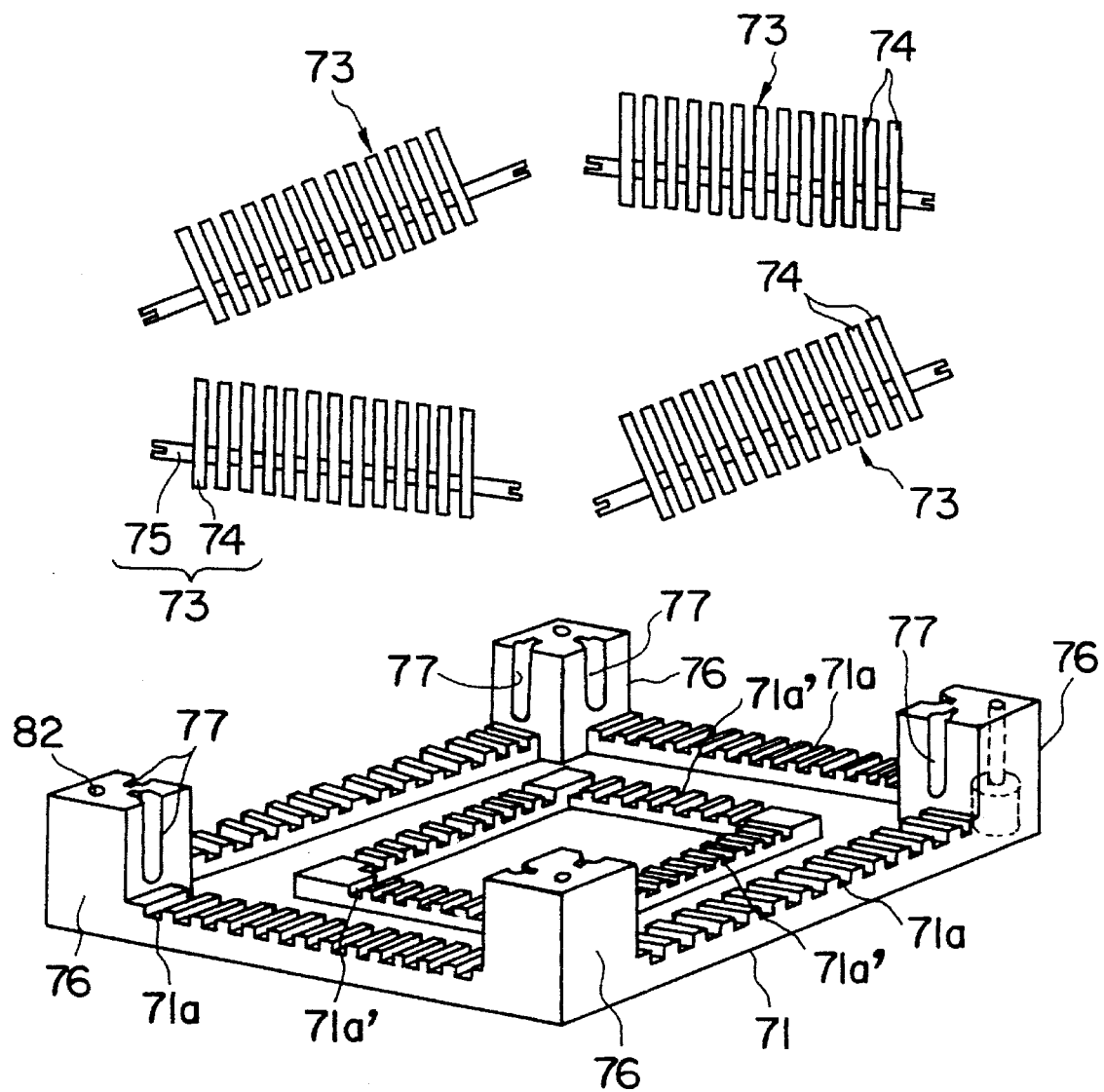
FIG. 14 illustrates perspective views of a socket body and guide wall assemblies of a fourth embodiment of an IC socket according to the present invention.
Figure 15:
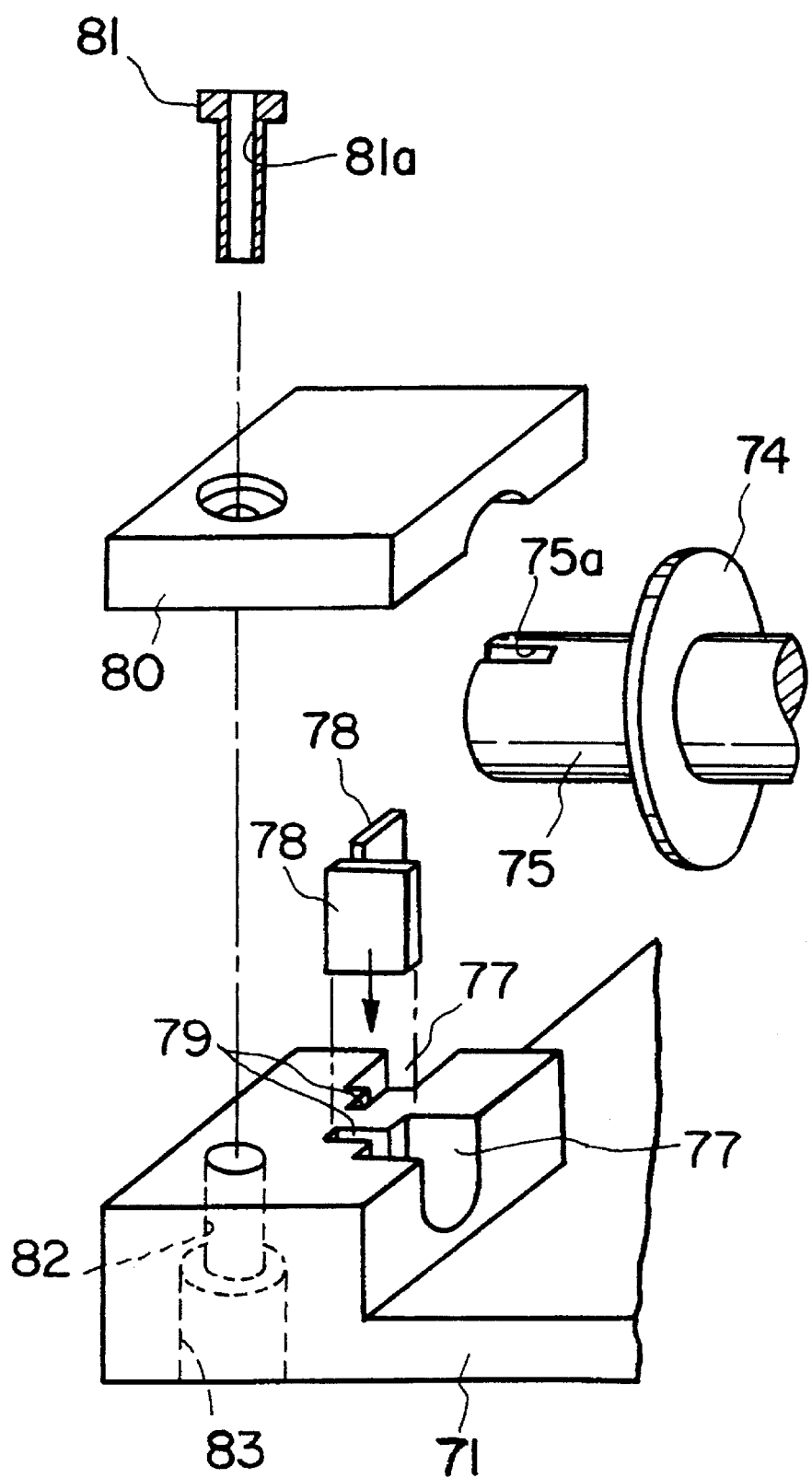
FIG. 15 is a partly exploded perspective view illustrating support of the guide wall assembly of the IC socket of the fourth embodiment.
Figure 16:
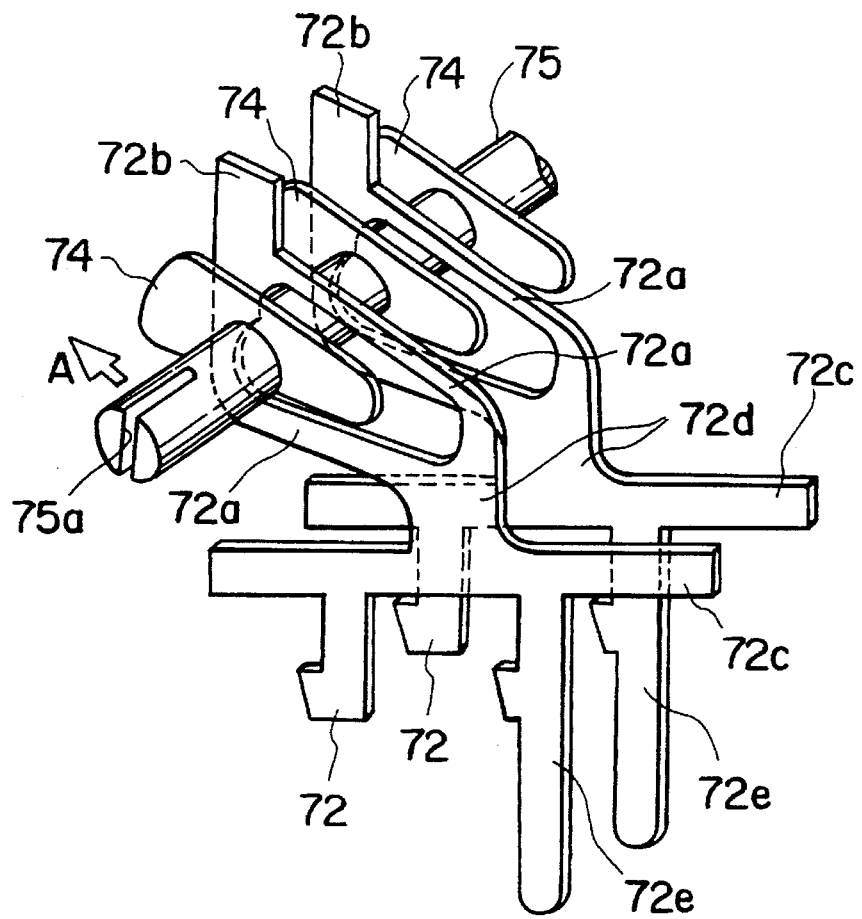
FIG. 16 is a partly exploded perspective view illustrating insertion of the guide wall assembly and contact pin of the IC socket of the fourth embodiment.
Figure 17:
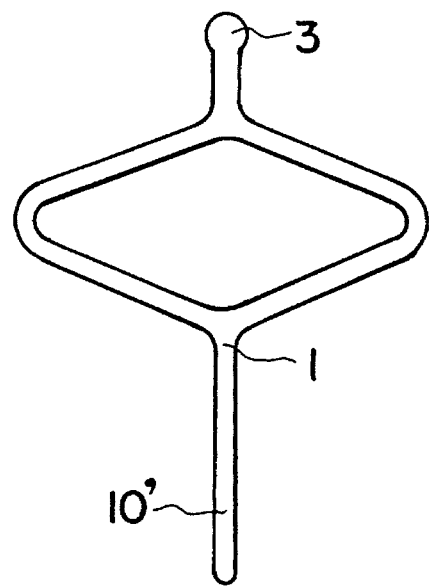
FIG. 17 is a front view of a conventional contact pin.

FIGS. 14 through 16 show a fourth embodiment for the IC socket according to the present invention. In the figures, socket body 71 has numbers of grooves 71a and 71a' for arrangement of contact pins 72. Each contact pins 72 is formed of a ring-like contact arm 72a made up of a pair of arm portions opposite to each other, and contact portion 72b to make contact with a lead of an IC device. Contact portion 72b is to contact the lead of the IC device (not shown), a body 72c, and neck 72d combines contact arm 72a with body 72c. Also provided are guide wall assemblies 73, each of which is formed of a number of guide walls 74 for guiding and insulating contact pins 72 and shaft 75 for fixing guide walls 74. Further provided are posts 76 for mounting guide wall assemblies 73 at corners of socket body 71.

In this embodiment, each of contact pins 72 is held on the socket body 71 as leg 72e thereof is inserted in socket body 71.

Contact arm 72a of contact pin 72 is not guided in any way in this position. Each of guide wall assemblies 73 are integrated of highly insulated synthetic resin or hard rubber. These guide wall assemblies are, is formed like a comb having guide walls 74 aligned on post are as shown in FIG. 14. Each of guide walls 74 is formed a little smaller than the virtually elliptic inside ring size of contact arm 72a so that it can be inserted in the ring. Guide walls 74 are aligned on shaft 75 at the same intervals as contact pins 72 arranged on socket body 71.

Each post 76 of socket body 71 has resting grooves 77 formed for supporting each end of each shaft 75 of guide wall assembly 73. The end of shaft 75 is placed in resting groove 77 so that guide wall assembly 73 can be horizontally fitted in position on grooves 71a and 71a' formed on socket body 71. Each of guide walls 74 of guide wall assembly 73 can be put in between arm portions 72a of adjacent contact pins 72 as keys 78 fit in keyways 79 formed on posts 76 and keyways 75a formed on the ends of shaft 75.

In FIG. 15 cover 80 is provided which fits on posts 76 so that it can enclosed both ends of shafts 75 fitted in resting grooves 77. Also provided are eyelets 81 for fastening fitted cover 80. Each eyelets 81 has a through hole 81a opened in its center. Each of posts 76 has a through hole 83 formed below a hole 82 for fixing eyelet 81. Through holes 81a of eyelets 81 and through holes 83 are used to mount socket body 71 on a circuit board (not shown).

Since the IC socket according to the present invention is formed as described so far, large numbers of guide walls 74 are injection-molded together with shafts 75 separately from socket body 71. Individual forming of guide wall assemblies 73 does not cause insufficient filling of mold with plastic material when guide walls 74 are formed. This allows highly precise forming at minute intervals easily and securely. Of course, socket body 71 itself can be easily formed as it is separated from guide wall assemblies 73.

In turn, in order to assemble the IC socket according to the present invention, each of guide wall assemblies 73 is inserted into the inside of the rings of contact arms 72a of the contact pins 72 to be aligned on socket body 71 with the use of jigs. Inserted guide walls 74, as shown in FIG. 16 are put in between adjacent contact pins 72. Guide wall 74 and contact pins 72 are then mounted on socket body 71 with the use of jigs in a way that body 72c of each of contact pins 72 is fitted in grooves 71a and 71a' of socket body 71 by way of leg 72e until contact pins 72 are aligned at predetermined intervals on the socket body 71.

Guide wall assembly 73 is virtually matched with the inside of the rings of contact arms 72a and guide walls 74 in the insertion and installed state. From this state shaft 75 is moved a little toward the front free end side of contact arms 72a as indicated by arrow A in FIG. 16. After this, both ends of Thus, shaft 75 fit in resting grooves 77 of posts 76. Shaft 75, as described above, is horizontally positioned above contact pins 72 aligned on socket body 71. Keyways 79 of posts 76, in turn, are aligned with keyways 75a on both ends of shaft 75 to allow keys 78 to fit in keyways 79 and 75a. Cover 80, in turn, is put over them and secured with eyelets 81.

Thus guide walls 74 of each of guide wall assemblies 73 are placed between posts 76 by way of shaft 75 and, have been interposed in adjacent contact pins 72 and aligned and held to oppose front free ends of contact arms 72a. Since guide walls 74 are aligned in between the front free ends of contact arms 72a of contact pins 72, contact arms 72a can be securely guided along guide walls 74 when contact pins 72 make contact with the leads of the IC device. In addition, contact arms 72a can be completely isolated from each other.

As described above, the IC socket according to the present invention has the advantage that the guide wall assembly being provided separately from the socket body can securely guide the very large number of thin contact pins. This is effective for the current IC devices having increased number of pins aligned at narrow intervals.

What is claimed is:

1. A contact pin for an IC socket for electrical connecting any one of the leads of an IC device with external electrical circuits comprising; a base; a pair of straight arms disposed parallel to and opposite each other; basal connecting means connecting ends of said pair of straight arms; said basal connecting means being connected to said base; second connecting means connecting the ends of said parallel straight arms opposite said basal connecting means; said straight arms, basal connecting means and second connecting means substantially forming a parallelogram; a contact portion means extending away from said second connecting portion, said contact portion means having an end for receiving a pushing force on said contact pins from a lead of said IC device.

2. The contact pin according to claim 1 including; restricting means on said parallelogram formed by said pair of straight arms for limiting plastic deformation of said pair of straight arms.

3. An IC socket, characterized by a plurality of ring-like contact pins aligned on a socket body to receive leads of an IC device;

an IC device body with said leads being pressed against said contact pins on said respective leads as a cover having a pad linked with the socket body is closed;

a shaft having guide walls for insertion between said contact pins being inserted in ring-like contact pins and fixed on the socket body so that said contact pins are isolated from each other;

said shaft having ends fitting in resting grooves formed on posts provided at corners of said socket body;

keys fitting in key ways on both ends of said shaft and the resting grooves to lock said shaft;

both ends of said shaft fitted and locked being enclosed by said cover, and said shaft being integrated into the socket body by fastening means.

4. An IC socket comprising; a plurality of contact pins aligned on a socket body for contact with leads of an IC device; cover means hingedly linked to said socket body; said cover means constructed to press said leads into contact with said contact pins when said cover means is closed; each of said contact pins comprising a free end for contact with the lead of an IC device, a pole on the end opposite said free end for securing said contact pin to an IC socket, a pair of substantially parallel arms opposite each other, said pair of parallel arms joining said free end with said pole and forming a ring, whereby said contacts may receive the force of a lead on said free end without distorting or breaking; guide and restriction means being formed on said front free end and fixed rear end of each contact pin to guide said contact pin movement on said socket body; and insulating means formed on said contact pin.

5. An IC socket comprising; a plurality of contact pins aligned on a socket body for contact with leads of an IC device; cover means hingedly linked to said socket body; said cover means constructed to press said leads into contact with said contact pins when said cover means is closed; each of said contact pins comprising a free end for contact with the lead of an IC device, a pole on the end of opposite said free end for securing said contact pin to an IC socket, a pair of substantially parallel arms opposite each other, said pair of parallel arms joining said free end with said pole and forming a ring, whereby said contact may receive the force of a lead on said free end without distorting or breaking; shaft means; a plurality of guide walls on said shaft means; said guide walls fitting into said contact pin rings; said shaft means and guide walls being secured to said socket body whereby said contact pins are isolated from each other.

6. The IC socket according to claim 5 including posts formed on the corners of said socket body; resting grooves formed on each post; each end of a shaft fitting in said resting grooves whereby said guide walls isolating adjacent contact pins are securely mounted on each socket body.

7. The IC socket according to claim 6 including a key way formed between each end of said shaft and said resting groove; and key means locking the end of each shaft in said resting groove.

* * * * *